United States Patent
Bartling et al.

(10) Patent No.: US 9,013,217 B2
(45) Date of Patent: Apr. 21, 2015

(54) DUAL-PORT NEGATIVE LEVEL SENSITIVE DATA RETENTION LATCH

(71) Applicant: Texas Instruments Incorporated, Dallas, TX (US)

(72) Inventors: Steven Craig Bartling, Plano, TX (US); Sudhanshu Khanna, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/311,752

(22) Filed: Jun. 23, 2014

(65) Prior Publication Data

US 2015/0061739 A1  Mar. 5, 2015

Related U.S. Application Data

(60) Provisional application No. 61/870,594, filed on Aug. 27, 2013.

(51) Int. Cl.
*H03K 3/00* (2006.01)
*H03K 3/356* (2006.01)

(52) U.S. Cl.
CPC .............................. *H03K 3/356008* (2013.01)

(58) Field of Classification Search
USPC ................. 327/115, 116, 117, 118, 161, 185, 327/198–203, 208–218, 355–360; 377/47, 377/48

See application file for complete search history.

(56) References Cited

U.S. PATENT DOCUMENTS

| | | | |
|---|---|---|---|
| 6,762,638 B2 * | 7/2004 | Correale et al. ............... | 327/202 |
| 7,145,818 B2 * | 12/2006 | Fukuoka et al. ............... | 365/201 |
| 7,639,056 B2 * | 12/2009 | Gururajarao et al. .......... | 327/202 |
| 2004/0051574 A1 * | 3/2004 | Ko et al. ........................ | 327/218 |
| 2006/0181910 A1 * | 8/2006 | Khan et al. ..................... | 365/49 |
| 2009/0262588 A1 * | 10/2009 | Vilangudipitchai et al. .......................... | 365/189.11 |
| 2013/0182500 A1 * | 7/2013 | Jung et al. ...................... | 365/158 |
| 2014/0211576 A1 * | 7/2014 | Bartling et al. ........... | 365/189.16 |

* cited by examiner

*Primary Examiner* — Brandon S Cole

(74) *Attorney, Agent, or Firm* — John R. Pessetto; Frank D. Cimino

(57) ABSTRACT

In an embodiment of the invention, a dual-port negative level sensitive data retention latch contains a clocked inverter and a dual-port latch. Data is clocked through the clocked inverter when clock signal CKT goes high, CLKZ goes low and retention control signal RET is low. The dual-port latch is configured to receive the output of the clocked inverter, a second data bit D2, the clock signals CKT and CLN, the retain control signals RET and the control signals SS and SSN. The signals CKT, CLKZ, RET, SS and SSN determine whether the output of the clocked inverter or the second data bit D2 is latched in the dual-port latch. Control signal RET determines when data is stored in the dual-port latch during retention mode.

3 Claims, 4 Drawing Sheets

DATA LATCHED IN
DUAL-PORT LATCH 108

DATA LATCHED IN
DUAL-PORT LATCH 108

DUAL-PORT NEGATIVE LEVEL SENSITIVE DATA RETENTION LATCH

This application claims priority from Provisional Application No. 61/870,594, filed Aug. 27, 2013.

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as theft primary supply. For example, cellular phones, personal computing devices, and personal sound systems are devices that are in great demand in the consumer market. It is also important that data on these devices be retained even when no power is supplied to the electronic device. Non-volatile memory circuits and non-volatile logic circuits are often used to meet these requirements.

Non-volatile logic implementation often requires updating sequential elements, such as latches, from a source external to the sequential element, such as a non-volatile memory. When non-volatile logic circuits are implemented to allow the updating of sequential elements, it is desired that the implementation of the non-volatile logic circuit does not significantly slow the operation of a sequential element.

DETAILED DESCRIPTION

Figure 1:
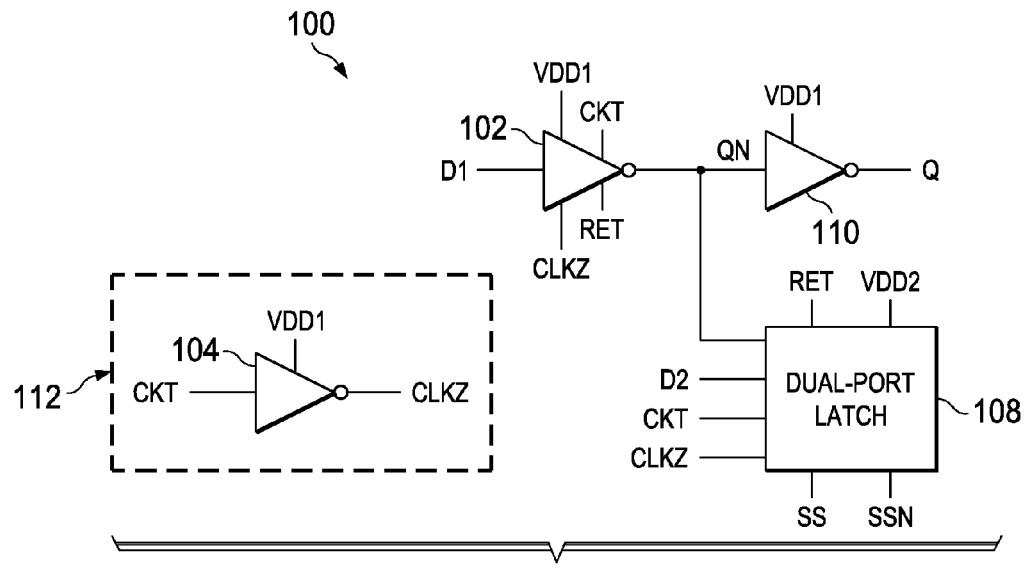
FIG. 1 is a block diagram of a dual-port negative level sensitive data retention latch according to an embodiment of the invention.

In an embodiment of the invention a dual-port negative level sensitive data retention latch 100 contains a clocked inverter 102, an inverter 110, a dual-port latch and a logic circuit 112 used to create clock CLKZ. The clocked inverter 102 is configured to receive a first data bit D1, a retain control signal RET, and internal clock signals CLKZ and CKT. The dual-port latch 108 is configured to receive the output QN from the clocked inverter 102, data input D2, clock signals CLKZ and CKT, the retain control signal RET and control signals SS and SSN. The signals CKT, CLKZ, RET, SS and SSN determine whether the output QN of the clocked inverter 102 or the second data bit D2 is latched in the dual-port latch 108.

Non-volatile logic implementations often require updating sequential elements (e.g. flip-flops and latches) from an external source (e.g. non-volatile memory). In an embodiment of the invention, the dual-port latch includes 108 a second data input (port). The second data input is used to insert data from an external source. A tri-state inverter is added to the dual-port latch 108 to accommodate the second data input. This will be explained in more detail later in the specification. When external data needs to be inserted into the dual-port latch, the tri-state inverter is enabled.

The circuitry used to add the second input to the dual-port latch 108 is not part of the critical timing path of the dual-port negative level sensitive data retention latch 100. As a result, change to the regular performance of the dual-port negative level sensitive data retention latch 100 is negligible.

FIG. 1 is a block diagram of a dual-port negative level sensitive data retention latch 100 according to an embodiment of the invention. In a functional (i.e. normal) mode of operation, the retention mode signal RET is held at a logical low level, the control signal SS is held at a logical low level and the binary compliment signal SSN of the control signal SS is held a logical high level. Power is needed for functional mode operation so power supply VDD1 and power supply VDD2 are applied to the dual-port negative level sensitive data retention latch 100.

Figure 2:
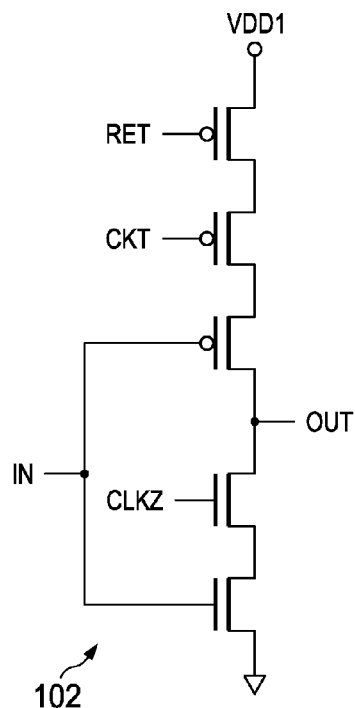
FIG. 2 is a schematic diagram of a clocked inverter according to an embodiment of the invention. (Prior Art)
Figure 7:
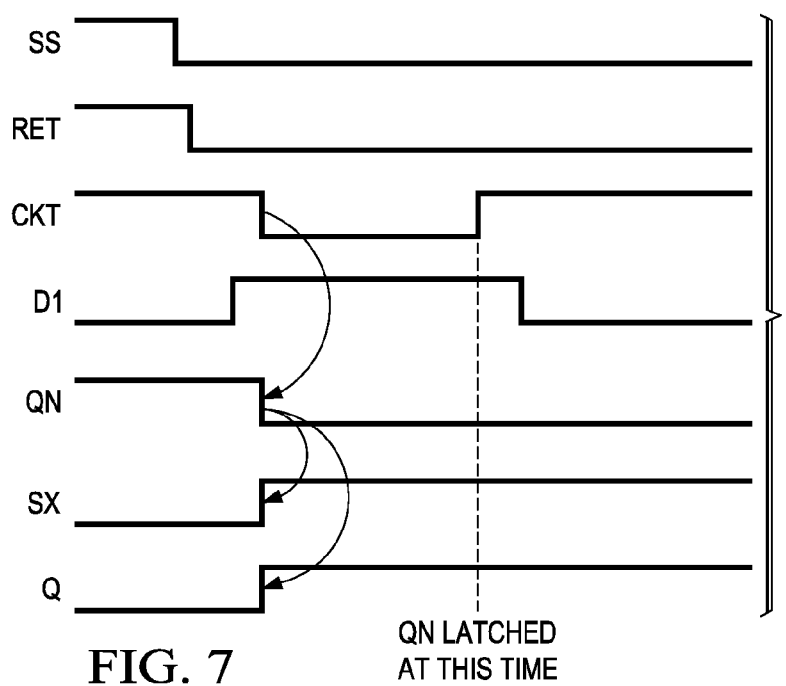
FIG. 7 is a timing diagram showing signals SS, RET, D1, CLK, QN and the output of the latch Q according to an embodiment of the invention.

FIG. 7 is a timing diagram showing data bit D1, clock signals CKT and CLKZ and the output Q of the dual-port negative level sensitive data retention latch 100 during the functional mode of operation. Because the RET is held at a logical low level, the binary logical compliment of D1 is passed to the output QN when clock signal CKT transitions from a high to low logical value. FIG. 2 illustrates an embodiment of a clocked inverter 102. QN is then presented to an input of the dual-port latch 108 and the inverter 110. The output of inverter 110 drives the signal Q.

Figure 3:
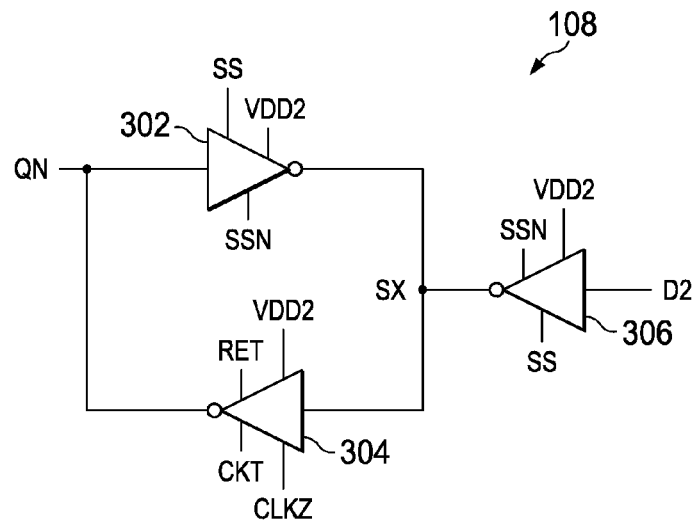
FIG. 3 is a schematic diagram of a dual-port latch according to an embodiment of the invention.
Figure 4:
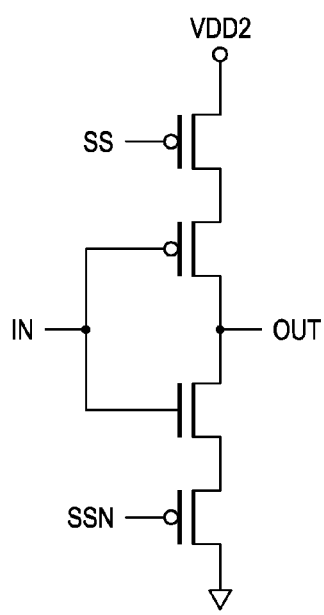
FIG. 4 is a schematic diagram of a tri-state inverter according to an embodiment of the invention. (Prior Art)
Figure 5:
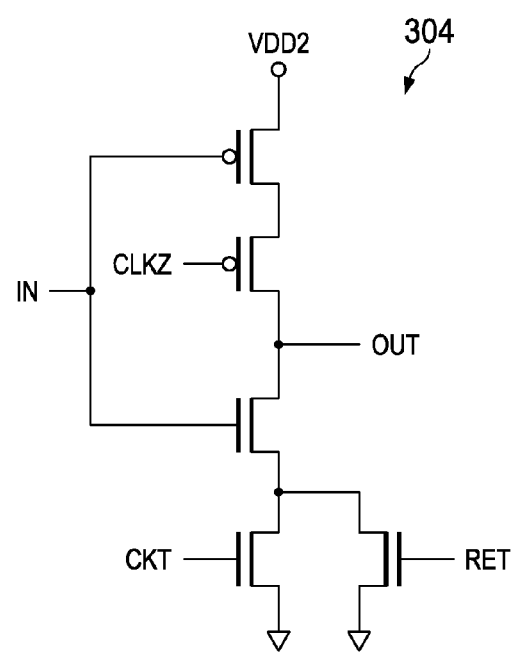
FIG. 5 is a schematic diagram of a clocked inverter according to an embodiment of the invention. (Prior Art)
Figure 6:
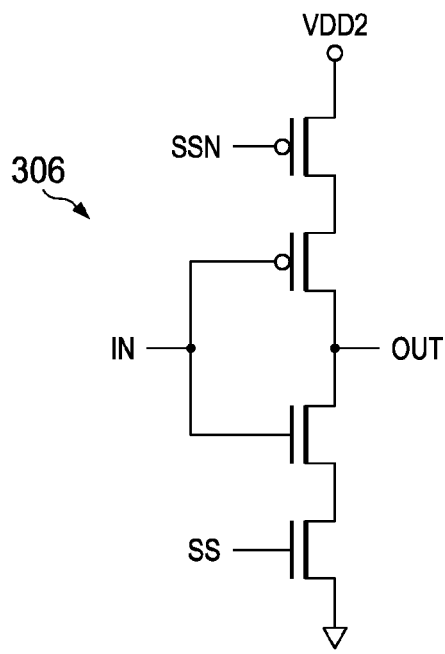
FIG. 6 is a schematic diagram of a tri-state inverter according to an embodiment of the invention. (Prior Art)

FIG. 3 is a schematic diagram of a dual-port latch 108 according to an embodiment of the invention. The dual-port latch 108 includes a first tri-state inverter 302 (see FIG. 4 for an embodiment of the first tri-state inverter 302) with tri-state controls SS and SSN, a clocked inverter 304 (see FIG. 5 for an embodiment of the clocked inverter 304) with control RET and a second tri-state inverter 306 (see FIG. 6 for an embodiment of the second tri-state inverter 306) with tri-state controls SS and SSN.

When the dual-port negative level sensitive data retention latch 100 is operating in the functional mode, the tri-state inverter 302 is active and drives node SX of the dual-port latch 108 to the complimentary logical value of QN. When the clock signal CKT transitions from a low logical level to a high logical level, the logical level on the QN is latched by the clocked inverter 304. In this embodiment of the invention, an inverter 110 is used to buffer QN. However, non-inverting buffers may be used as well. The tri-state inverter 306 is tri-stated in this mode because SS is a logical low level and SSN is a logical high level. As a result, D2 is not transferred to node SX.

Figure 8:
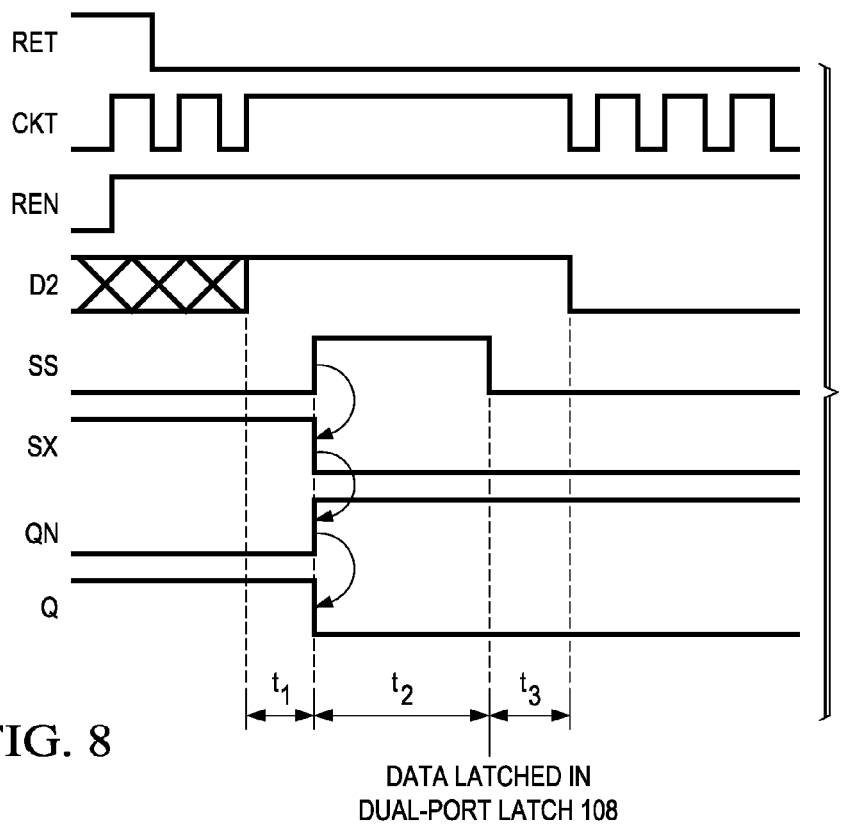
FIG. 8 is a timing diagram showing signals RET, CKT, D2, SS, SX, QN, and Q according to an embodiment of the invention.

However, during another functional mode of operation (e.g. when RET=0), data D2 may be written directly to the dual-port latch 108 (See FIG. 8). During this functional mode, the clock signal CKT is held at a high logical level and CLKZ is held at a low logical level with control signal SS held at a logical high level and control signal SSN held at logical low level.

When control signal SS is held at a logical high level and control signal SSN is held at logical low level, tri-state inverter 306 is able to drive the complimentary value of D2 onto node SX of the dual-port latch 108. Because CLKZ and RET are held at logical low levels and CKT is held at logical high level, the clocked inverter 304 is active and drives node QN to the logical value of D2. The inverter 110 then inverts the logical value on node QN to its compliment. In this example, the compliment of D2 is presented on node Q. Data signal D2 must be held for the period t3 to insure that the correct value of D2 is latched. Also, control signal SS must remain at logical high value for time t2 to insure that the correct value D2 is latched.

When control signal SS is driven from a logical high level to a logical low level and SSN is driven from a logical low level to a logical high level, the tri-state inverter 306 is tri-stated and tri-state inverter 302 becomes active latching the logical value on node QN of the dual-port latch 108.

The dual-port negative level sensitive data retention latch 100 can also be operated to retain data (RET mode) in the dual-port latch 108 (power supply VDD2 is active) when clocked inverter 102, logic circuit 112 and inverter 110 are powered off (i.e. power supply VDD1 is inactivated). Because the dual-port negative level sensitive data retention latch 100 is being operated in the RET mode, the retention mode signal RET is held at a logical high level and the SS and SSn signals are at a logic 0 and logic 1 respectively. Because power is not supplied to clocked inverter 102 and the inverter 110, QN is not actively driven by clocked inverter 102. In this manner, the data being retained in the dual-port latch 108 will not be inadvertently corrupted by the indeterminate output value of the clocked inverter 102 (the input is indeterminate as the supply VDD1 is inactive or floating). All other inputs are don't-cares.

Figure 9:
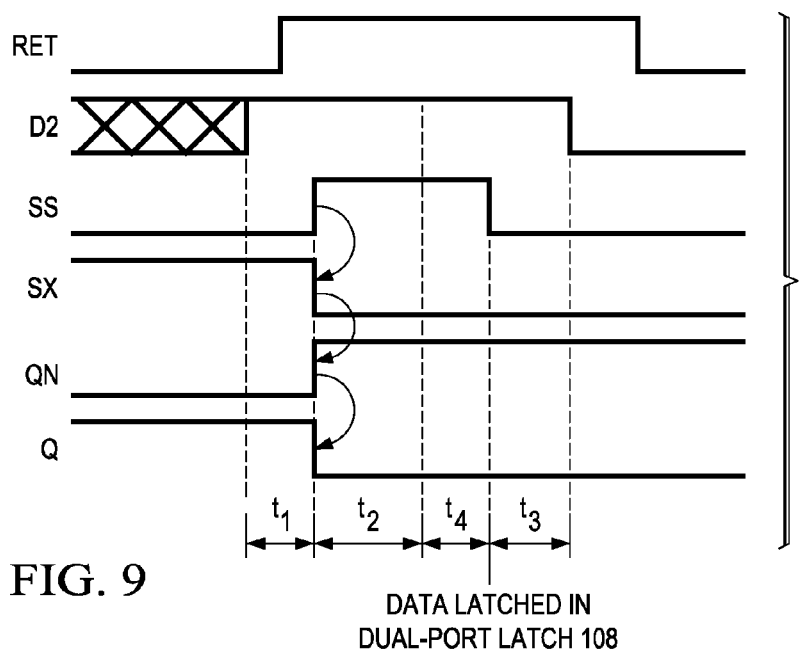
FIG. 9 is a timing diagram showing signals RET, D2, SS, SX, QN, and Q according to an embodiment of the invention.

During retention mode of operation, data D2 may be written directly to the dual-port latch 108. During this retention mode, the control signal SS is driven to a logical high level following RET being driven to a logical high value (see FIG. 9). The clock signals CKT and CLKZ are don't cares in this mode of operation in this embodiment. Before time t1, D2 does not have to be driven to a logical level (i.e. D2 may be a logical one, a logical zero, floating or tri-stated). D2 must be driven to a logical one or a logical zero some time t1 before the control signal SS transitions from a logical zero to a logical one. D2 must be stable for time t4 before the control signal SS transitions from a logical one to a logical zero and remain stable for time t3 afterwards in order to ensure D2 will be correctly latched.

Because the control signal SS is driven to a logical high level following RET being driven to a logical high value, the tri-state inverter 302 is tri-stated and does not drive node SX of the dual-port latch 108. Because the control signal SS is driven to a logical high and control signal SSN is driven to a logical low value, the tri-state inverter 306 is active and drives node SX to the complimentary value presented on D2. Because RET is a logical high value, the clocked inverter 304 is active and drives node QN. When the control signal SS returns to a logic low level and SSN returns to a logic high level, the value stored on node QN is latched between tri-state inverter 302 and clocked inverter 304 while tri-state inverter 306 is tri-stated. Data signal D2 must be held for the period t3 to insure that the correct value of D2 is latched. Also, control signal SS must remain at logical high value for time (t2+t4) to insure that the correct value D2 is latched. Under this condition, the data written from D2 remains latched in the dual-port latch 108 during retention mode.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A dual-port negative level sensitive data retention latch comprising:
   a clocked inverter configured to receive a first data bit, a first clock signal, a second clock signal and a retention mode control signal wherein the first clock signal, the second clock signal and the retention mode control signal determine whether a data output from the clocked inverter is the binary compliment of the first data bit or an indeterminate value;
   a dual-port latch configured to receive the data output of the clocked inverter, a second data bit, the first clock signal, the second clock signal, the retention mode control signal, a first latch control signal and a second latch control signal wherein signals the first clock signal, the second clock signal, the retention mode control signal, the first latch control signal and the second latch control signal determine whether the data output of the clocked inverter or the second data bit is latched in the dual-port latch;
   a first inverter wherein the first inverter receives the data output and the first inverter outputs a binary compliment of the data output; and
   wherein the clocked inverter and the first inverter receive power from a first power supply; wherein the dual-port latch receives power form a second power supply.

2. The dual-port negative level sensitive data retention latch of claim 1 wherein the first power supply is turned off and the second power supply is turned on during operation of a retention mode; wherein power is only supplied to the dual-port latch.

3. A method of writing data into a dual-port latch of a dual-port negative level sensitive data retention latch in retention mode comprising:
   entering retention mode by driving a retain control signal to a logical high value;
   disconnecting a first power supply from a clocked inverter configured to receive a first data bit, a first clock signal, a second clock signal and the retain control signal wherein the first clock signal, the second clock signal and the retain control signal determine whether a data output from the clocked inverter is the binary compliment of the first data bit or an indeterminate value;
   connecting a second power supply to the dual-port latch wherein the dual-port latch is configured to receive the data output of the clocked inverter, a second data bit, the first clock signal, the second clock signal, the retain control signal, a first latch control signal and a second latch control signal wherein signals, the first clock signal, the second clock signal, the retain control signal, a first latch control signal and a second latch control signal determine whether the data output of the clocked inverter or the second data bit is latched in the dual-port latch;
   driving the second data bit to a binary logical level;
   writing the second data bit into the dual-port latch by driving the first control signal to a logical high value and driving the second control signal to a logical low value;

latching the second data bit into the dual-port latch by driving the first control signal to a logical low value and driving the second control signal to a logical high value;
connecting the first power supply to clocked inverter;
exiting the retention mode and entering a functional mode by driving control the retain control signal to a logical low.

* * * * *